(12) United States Patent
Vogel et al.

(10) Patent No.: US 7,375,791 B2
(45) Date of Patent: May 20, 2008

(54) LAMINAR FLOW GAS CURTAINS FOR LITHOGRAPHIC APPLICATIONS

(75) Inventors: Herman Vogel, Sandy Hook, CT (US); Michael J. Parisi, Trumbull, CT (US)

(73) Assignee: ASML Holding N.V. (NL)

( * ) Notice: Subject to any disclaimer, the term of this patent is extended or adjusted under 35 U.S.C. 154(b) by 52 days.

(21) Appl. No.: 11/170,067

(22) Filed: Jun. 30, 2005

(65) Prior Publication Data

US 2007/0002292 A1    Jan. 4, 2007

(51) Int. Cl.
*G03B 27/52* (2006.01)
*G03B 27/42* (2006.01)

(52) U.S. Cl. .......................... 355/30; 355/53
(58) Field of Classification Search ................. 355/30, 355/53; 250/548, 492.2
See application file for complete search history.

(56) References Cited

U.S. PATENT DOCUMENTS

| | | | |
|---|---|---|---|
| 4,721,249 A * | 1/1988 | Lassiter | 239/288.5 |
| 5,559,584 A * | 9/1996 | Miyaji et al. | 355/73 |
| 5,590,537 A | 1/1997 | Vogel | |
| 6,890,080 B2 * | 5/2005 | Kalley et al. | 359/509 |

OTHER PUBLICATIONS

Dryden, H., "A Review of the Statistical Theory of Turbulence," Quarterly of Applied Mathematics, vol. 1(1):7-41, Brown University, Providence, Rhode Island (1943).

Schlichting, H., "Boundary-Layer Theory," McGraw-Hill Book Company, New York, New York, entire book (1968).

Schubauer, G.B. et al., National Advisory Committee for Aeronautics, Technical Note 2001, Aerodynamic Characteristics of Damping Screens, National Bureau of Standards (Jan. 1950).

Hatch, J. E. and Papell, S. S., "Use of a Theoretical Flow Model to Correlate Data for Film Cooling or Heating an Adiabatic Wall by Tangential Injection of Gases of Different Fluid Properties," TN D-130, 1959, NASA.

* cited by examiner

*Primary Examiner*—Henry Hung Nguyen
(74) *Attorney, Agent, or Firm*—Sterne, Kessler, Goldstein & Fox PLLC

(57) ABSTRACT

Laminar flow gas curtains for use in lithographic applications. In an embodiment, a gas curtain system includes a nozzle that enhances the fluidic purge process. The nozzle includes a first housing, a second housing, a flow distribution plate, and a plurality of flow conditioning channels. The first housing has an inlet for receiving a gas and encloses a first volume. The second housing encloses a second volume and is fluidly coupled to the first housing. The flow distribution plate controls the flow of gas from the first volume to the second volume. The plurality of flow conditioning channels are disposed within a portion of the second volume and are used to discharge the gas that forms the gas curtain. The length of the flow conditioning channels is selected to attenuate non-axial, gas velocity flow-vectors. The nozzle limits the gaseous mixing that occurs after the purge gas exits the nozzle channels and starts to purge a gaseous volume.

20 Claims, 11 Drawing Sheets

LAMINAR FLOW GAS CURTAINS FOR LITHOGRAPHIC APPLICATIONS

FIELD OF THE INVENTION

The present invention relates generally to lithography. More particularly, it relates to laminar flow gas curtains for lithography applications.

BACKGROUND OF THE INVENTION

Gas curtains are used in a variety of applications. In lithographic applications, they are used to maintain required gaseous purity levels within selected components such as the wafer stage and the wafer handling systems. Another example of gas curtain use is to provide thermally stable environments to facilitate interferometry measurements.

Available gas curtain systems, however, are inefficient because of the ease with which the purging gas mixes with environmental gases during the purge process. The gas used to form a gas curtain is a consumable, and the inefficient use of gas by available gas curtain systems adds to the overall cost of lithographic throughput.

What is needed for lithographic applications are new gas curtain systems that overcome the limitations and drawbacks of currently available gas curtain systems.

BRIEF SUMMARY OF THE INVENTION

The present invention provides laminar flow gas curtains for use in lithographic applications. In an embodiment, the gas curtain system includes a nozzle that enhances the fluidic purge process. The nozzle includes a first housing, a second housing, a flow distribution plate, and a plurality of flow conditioning channels. The first housing has an inlet for receiving a gas and encloses a first volume. The second housing encloses a second volume and is fluidly coupled to the first housing. The flow distribution plate controls the flow of gas in a uniform manner leading from the from the first volume to the second volume. The plurality of flow conditioning channels are disposed within a portion of the second volume and are used to discharge the gas that forms the gas curtain. The length of the flow conditioning channels is selected to attenuate non-axial, gas velocity flow-vectors which cause the mixing process.

According to the present invention, the nozzle limits gaseous mixing that occurs during purging of a gaseous volume. This is achieved, in part, by forcing the purge gas through the plurality of flow conditioning channels so that the purge gas is made to flow laminarly through the flow conditioning channels. The gaseous flow-field exiting the flow conditioning channels is axially directional and maintains its stream-tube direction after it exits the conditioning channels with little to no mixing occurring between tubular streamlines throughout a prescribed effective throw distance. Forcing the gas through the flow conditioning channels increases the pressure drop, which is used to achieve a laminar flow with a clean parabolic velocity profile.

Further features and advantages of the present invention, as well as the structure and operation of various embodiments of the present invention, are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable persons skilled in the pertinent art(s) to make and use the invention. In the drawings, like reference numbers indicate identical or functionally similar elements. Additionally, the left-most digit(s) of a reference number identifies the drawing in which the reference number first appears.

DETAILED DESCRIPTION OF THE INVENTION

The present invention provides laminar flow gas curtains for use in lithographic applications. In the detailed description of the invention that follows, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Figure 1:
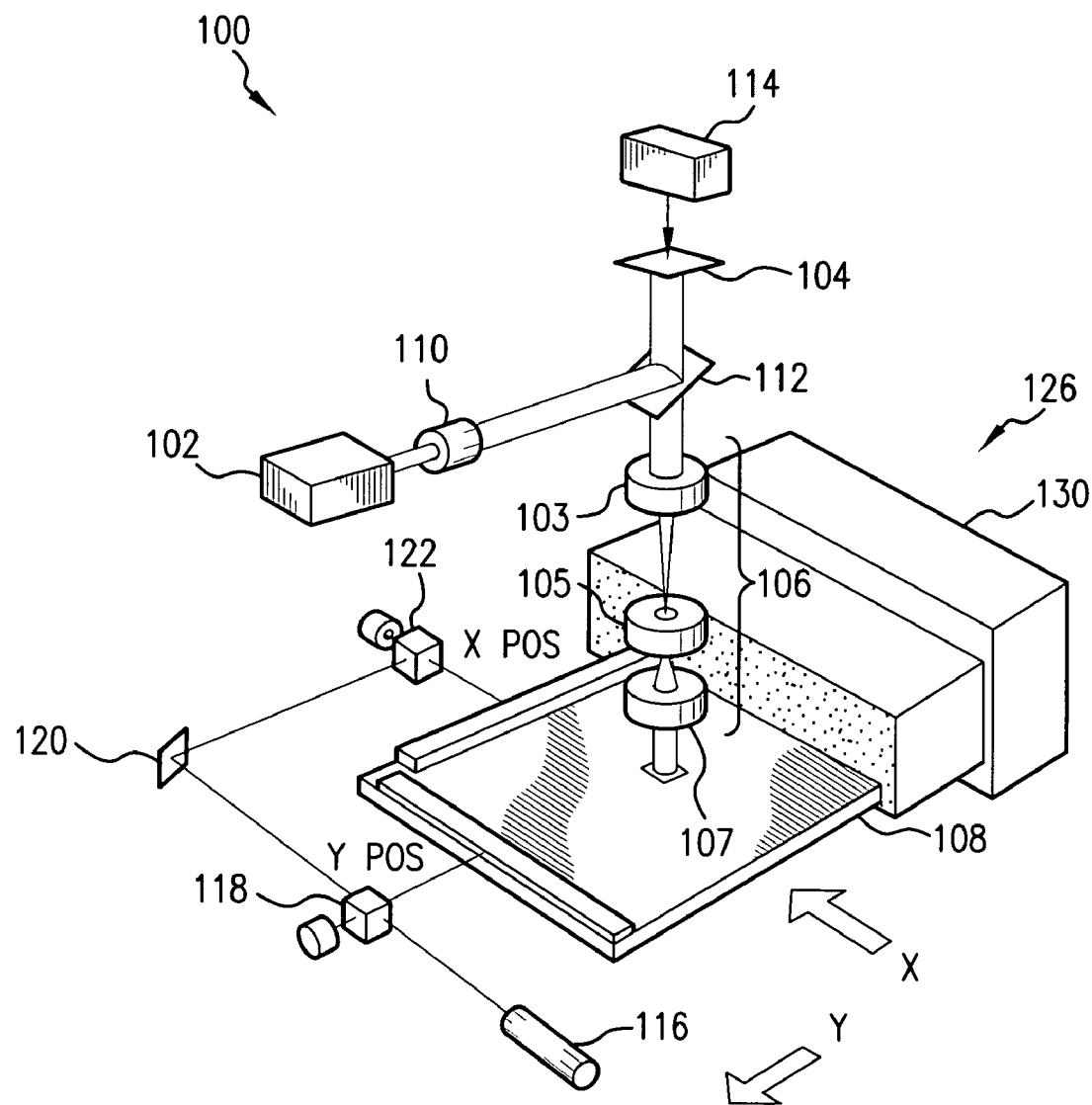
FIG. 1 is a schematic diagram of a lithographic tool having a gas curtain system according to an embodiment of the present invention.

FIG. 1 is a schematic diagram of a lithography tool 100 according to an embodiment of the present invention. Tool 100 includes an illumination source 102, a spatial light modulator 104, projection optics 106, a wafer stage 108, and a gas curtain system 126. Although lithography tool 100 is a maskless lithography tool, the present invention is not limited to only maskless tools. The present invention includes and can be used with all lithographic tools.

In an embodiment, illumination energy emitted by illumination source 102 is conditioned by illumination optics 110. Illumination energy exiting illumination optics 110 is directed to spatial light modulator 104 using a beam-splitter 112. In an embodiment, illumination source 102 is a pulsed excimer laser. A continuous illumination source also can be employed.

Spatial light modulator 104 is a reflective type spatial light modulator that includes a plurality of spatial light modulator cells (not shown). A pattern rasterizer 114 coupled to spatial light modulator 104 applies a signal to each of the spatial light modulator cells to form a die pattern. When applied to spatial light modulator 104, the signal produces a linearized pattern bitmap.

Illumination energy reflected from spatial light modulator 104 passes through beam-splitter 112 and enters projection optics 106. As shown in FIG. 1, in one embodiment, projection optics 106 includes a lens or lens group 103, an aperture 105, and a lens or lens group 107. A die image is formed using reflected illumination energy from the spatial light modulator cells that enters a pupil of projection optics 106.

Wafer stage 108 is moveable in the X and Y directions to permit step and scan lithography. The Y-direction position is controlled using motors (not shown) and interferometer 118. The X-direction position is controlled using motors (not shown) and interferometer 122. A laser 116 and a beam-splitter 120 are used to provide illumination to interferometer 118 and interferometer 122. The images formed by projection optics 106 can be located at different areas of wafer stage 108 by changing the position of wafer stage 108.

In an embodiment of the present invention, a spatial light modulator is used that controls the transmission or passage of illumination energy rather than the reflection of illumination energy. In this embodiment, the illumination optics are rearranged to appropriately illuminate the spatial light modulator.

Gas curtain system 126 includes a nozzle 130 and a source of gas (not shown). Gas curtain system 126 is used, for example, to purge wafer stage 108 and/or to control heat that would otherwise effect the operation of interferometers 118 and 122. The gas curtain (e.g., an air curtain) generated by gas curtain system 126 prevents hot ambient-air from penetrating and mixing within the interferometric control volume of lithographic tool 100, thereby preventing adverse index of refraction changes.

It is noted here that the size of nozzle 130, as well as the other components of lithography tool 100, are not drawn to scale.

Figure 2A:
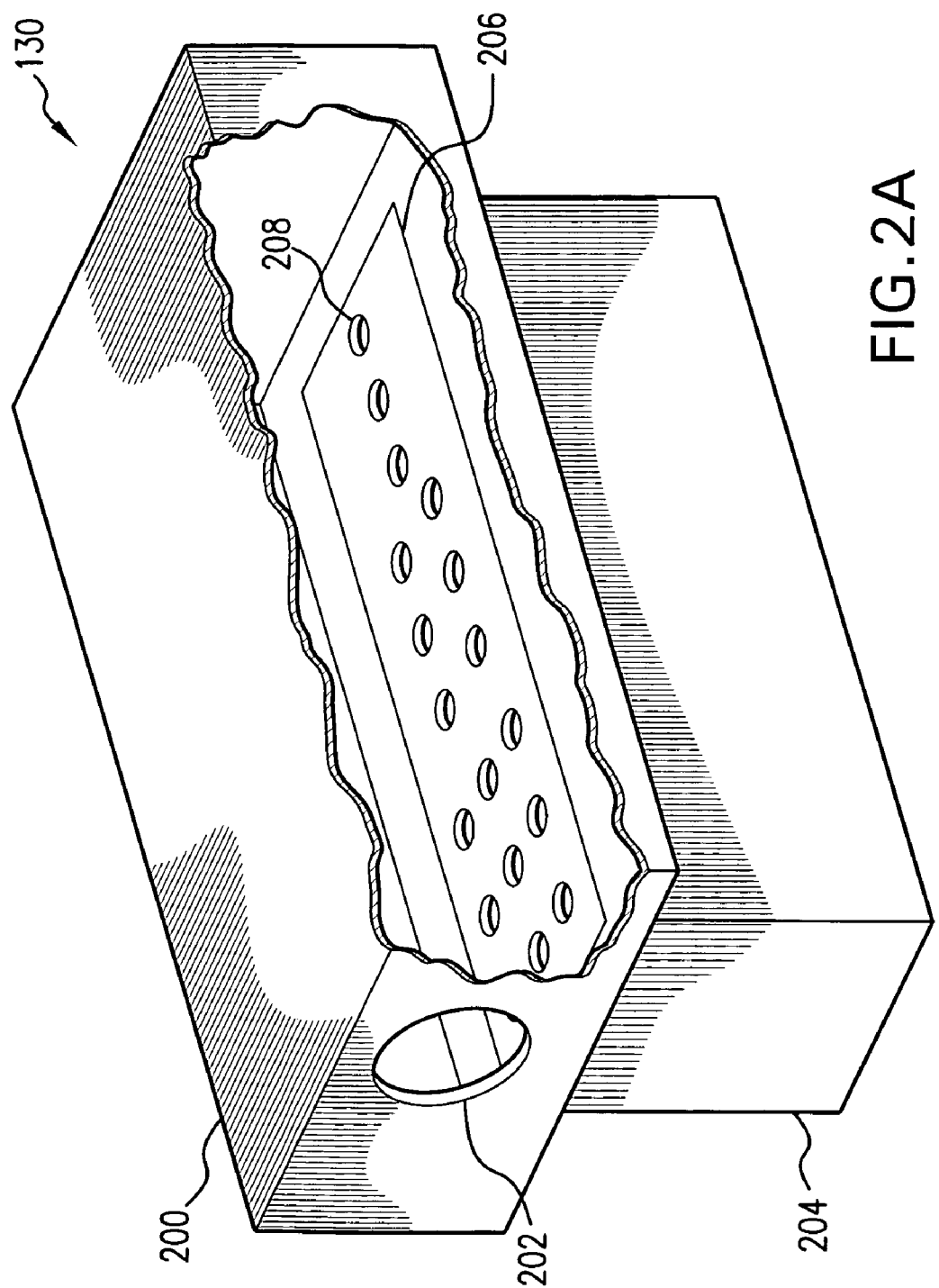
FIG. 2A is a schematic diagram of the nozzle of the gas curtain system of FIG. 1.

FIG. 2A is a schematic diagram of nozzle 130. As shown in FIG. 2A, nozzle 130 includes a first housing 200, a second housing 204, and a flow distribution plate 206. Nozzle 130 also includes a plurality of flow conditioning channels (see, e.g., FIG. 4), which are described below.

Housing 200 has an inlet 202 and is fluidly coupled to housing 204 through flow distribution plate 206. As shown in FIG. 2A, in a preferred embodiment, housing 200 and housing 204 are rectangular. Other shapes are used in other embodiments.

As shown in FIG. 2A, flow distribution plate 206 includes a plurality of holes 208. The size, number, and spacing of holes 208 in flow distribution plate 206 are selected to ensure that the flow of gas from first housing 200 is evenly distributed in the second volume enclosed by second housing 204.

In embodiments, the number of holes 208 per unit area is not uniform across flow distribution plate 206. This non-uniform distribution is based, for example, on the non-uniform pressures that exist in the first volume enclosed by housing 200. In the embodiment shown in FIG. 2A, the number of holes 208 per unit area is greatest at the end of flow distribution plate 206 near inlet 202, where the pressure in housing 200 is lowest. The number of holes 208 per unit area is lowest at the end of flow distribution plate 206 furthest from inlet 202, where the pressure is greatest.

Figure 2B:
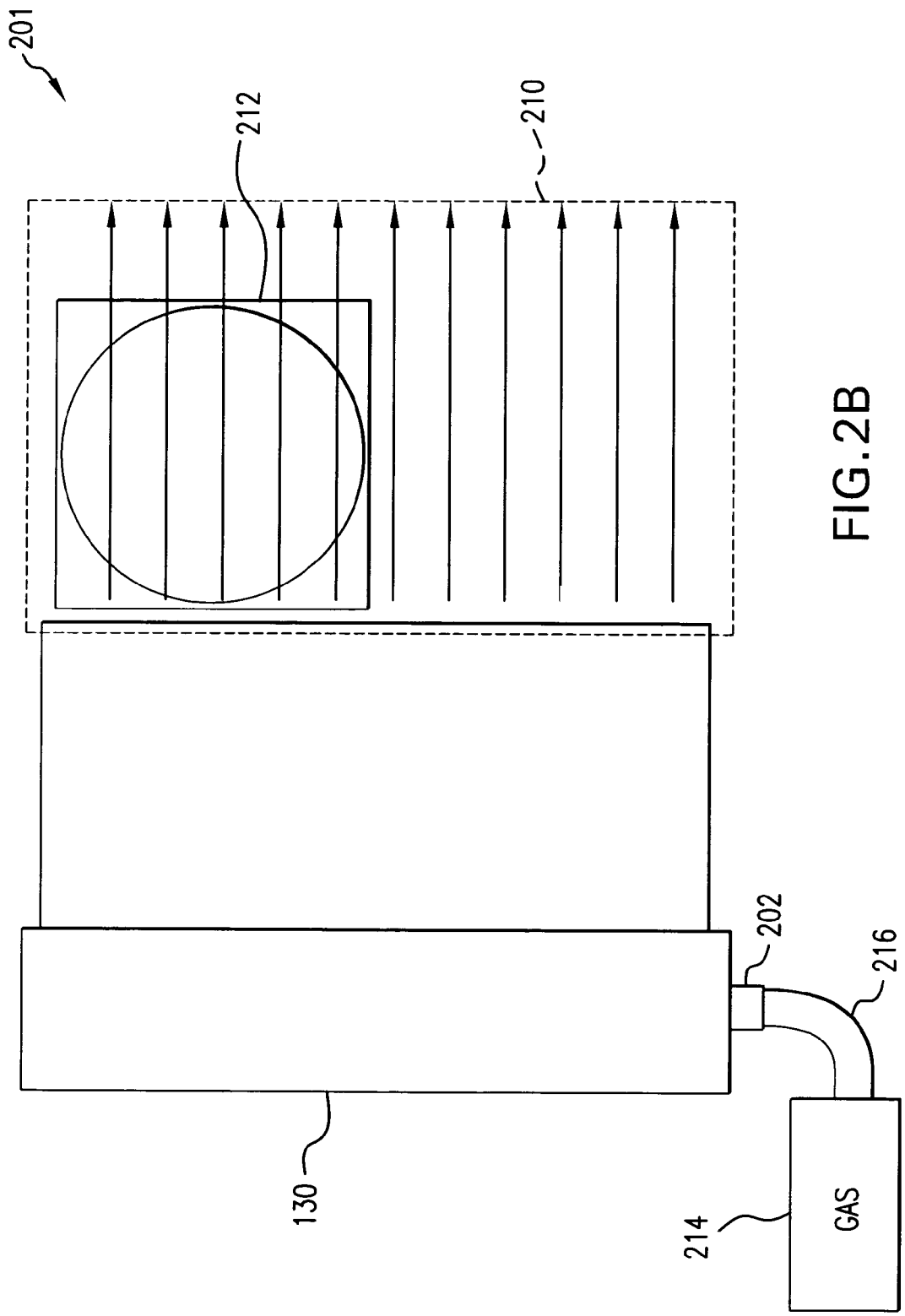
FIGS. 2B and 2C are schematic diagrams of a gas curtain system according to an embodiment of the present invention.
Figure 2C:
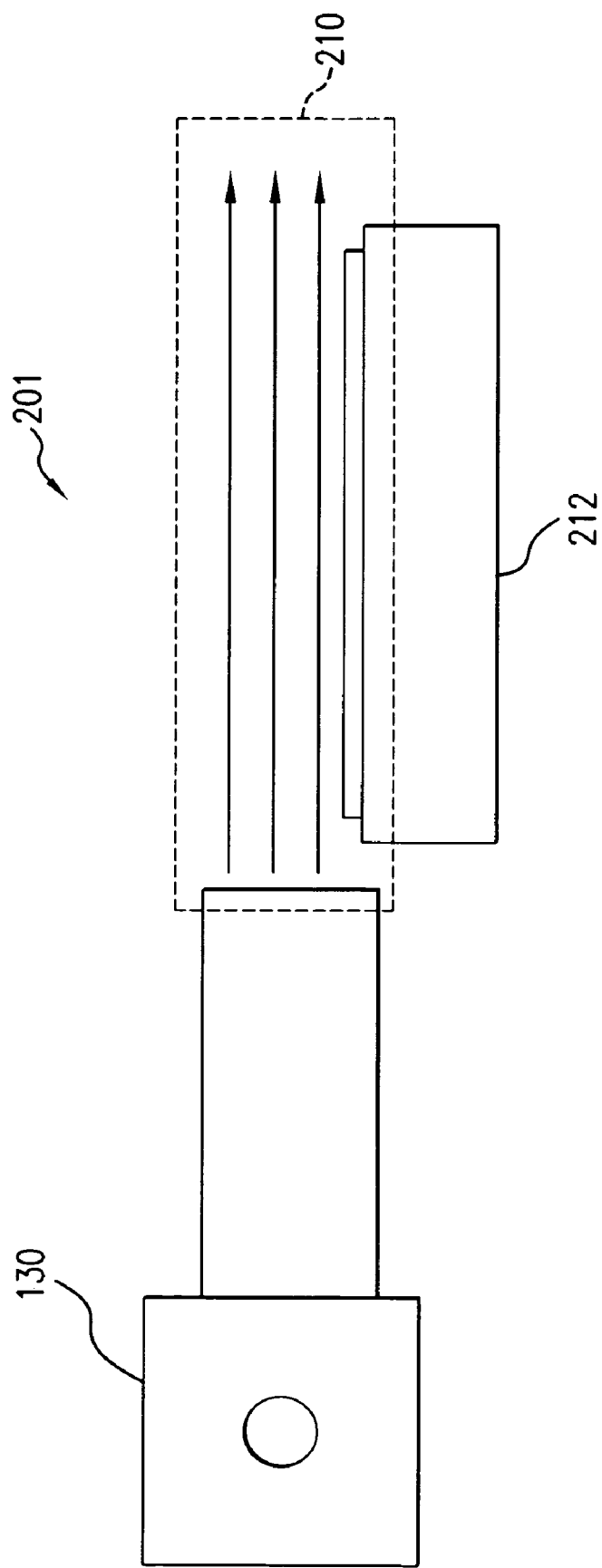

FIG. 2B is a schematic diagram (top view) of a gas curtain system 201 that uses nozzle 130 to form a gas curtain 210. Gas curtain 210 is shown as forming a barrier for a wafer stage 212 of a step-and-scan lithography tool. As shown in FIG. 2B, inlet 202 is coupled to a source of gas 214 by a hose 216, or the like as would become apparent to persons skilled in the relevant art. Gas source 214 provides a flow of gas to nozzle 130 sufficient to maintain gas curtain 210 during operation of the lithography tool. FIG. 2C is a schematic diagram (side view) that further illustrates gas curtain system 201.

Figure 3:
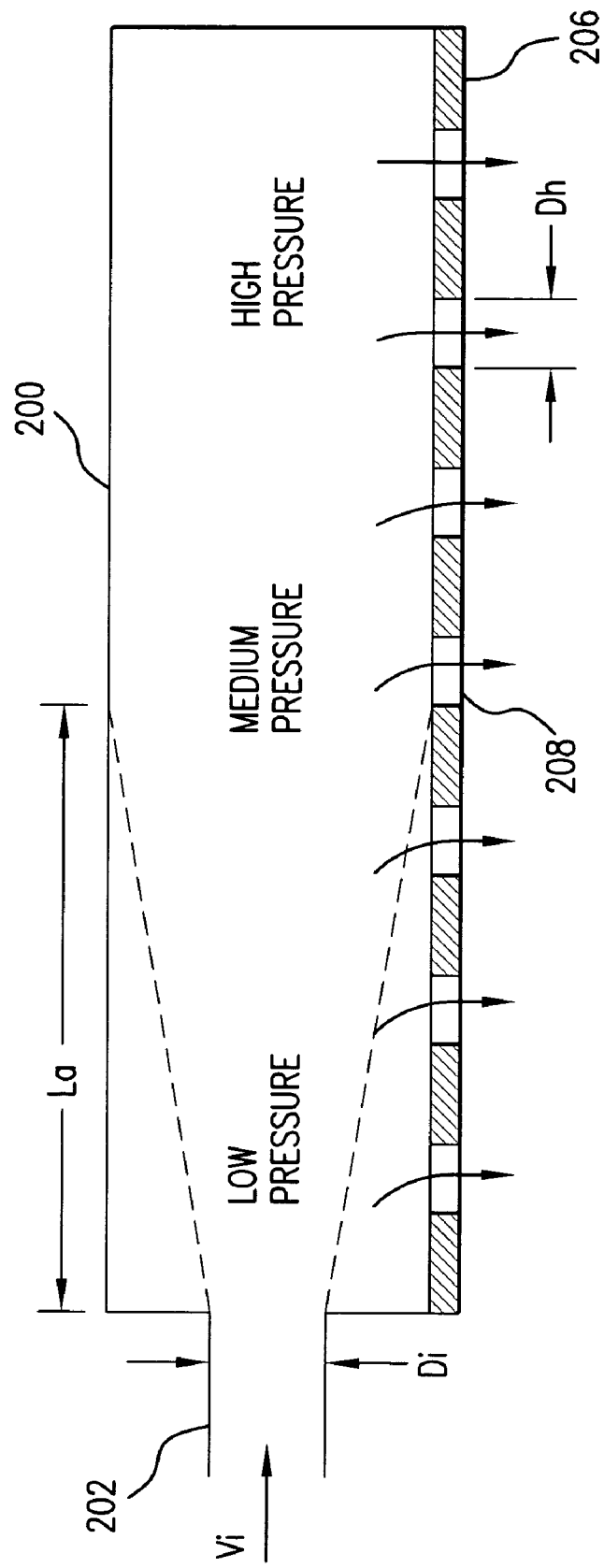
FIG. 3 is a schematic diagram of the first housing and the flow distribution plate of the nozzle of FIG. 2.

As shown in FIG. 3, a flow of gas enters first housing 200 through inlet 202. This flow of gas is distributed within a first volume enclosed by housing 200. Flow distribution plate 206 controls the distribution of the gas as it flows from housing 200 into housing 204 (see FIG. 2A) by applying a back-pressure to the entering flow-field.

The following example illustrates how to select parameters for housing 200 and flow distribution plate 206, according to an embodiment of the present invention, in order to achieve an appropriate back-pressure. For purposes of this example, consider a housing 200 having a length L, a width W, a height H, and an inlet diameter $D_i$. The length $L_a$ shown in FIG. 3 is at least 10 $D_i$. The diameter of the holes in flow distribution plate 206 are $D_h$.

For this example, consider that the gas entering housing 200 is air at a flow rate of $V_i$ equals 52 cubic feet per minute (CFM). Based on the parameters noted above, the mass flow (mf) entering housing 200 is $$mf = \rho \cdot V \cdot \left(\frac{\pi \cdot Dh^2}{4}\right) = 0.03\left(\frac{\text{kg}}{\text{sec}}\right),$$

where $$\rho = \frac{\text{kg}}{\text{m}^3}$$

and $$V = \frac{\text{m}}{\text{sec}}.$$

The pressure drop is $$\Delta P = \kappa \cdot \rho \cdot \frac{v^2}{2},$$

where κ equals a head loss factor of 1. The volumetric flow rate is $$Q = \frac{mf}{\rho} = V \cdot \left(\frac{\pi \cdot Dh^2}{4}\right),$$

where $$mf = \frac{kg}{sec},$$

$$D = m,$$

and $$\left(\frac{mf}{A} = \rho \cdot V\right).$$

The pressure drop in housing 200 is based on inlet conditions and the geometry of housing 200. The pressure drop in Pascals is given by:

$$\Delta P\_P = \left[1 + \left[4 \cdot \left(\frac{5 \cdot L}{Di}\right) \cdot f\right]\right] \cdot \left(\frac{8 \cdot mf^2}{\pi^2 \cdot Di^4 \cdot \rho c}\right),$$

where $f$ is a friction factor and the density of air ($\rho c$) is equal to 1.2 kg/m$^3$. Letting ReD equal the Reynolds Number, where ReD equals $$(\rho \cdot v) \cdot \left(\frac{Dh}{\mu c}\right) = \left(\frac{mf}{A}\right) \cdot \left(\frac{Dh}{\mu c}\right) = \frac{4 \cdot mf}{\pi \cdot Dh \cdot \mu c},$$

the friction factor $f$ equals 16/ReD if ReD is less than or equal to 2300 (laminar tube flow). The friction factor $f$ equals $$f = 2.4 \cdot 10^{-8} \cdot \left(\frac{e}{Dh}\right)^{0.0118} \cdot \text{ReD}^{1.644}$$

if ReD is greater than or equal to 2300 and less than or equal to 4000 (transition tube-flow from laminar through turbulent), where $$10^{-7} \leq \left(\frac{e}{Dh}\right) \leq 0.1$$

(tube roughness) and e equals 2·10$^{-6}$ (smooth tubes). The friction factor $$f \text{ equals } \frac{1}{\sqrt{(4 \cdot f)}} = 1.74 - 2.0 \cdot \log\left[2 \cdot \left(\frac{e}{Dh}\right) + \frac{18.7}{\sqrt{(4 \cdot f)}} \cdot \frac{1}{\text{ReD}}\right]$$

for ReD greater than 4000.

The flow distribution plate pressure drop is given by:

$$\Delta P\_h = 1.5 \cdot \left(\rho \cdot \frac{vp^2}{2}\right) = \left(1.5 + 4 \cdot \frac{Lp}{Dh} \cdot f\right) \cdot \left(\frac{8 \cdot mf}{Nh^2 \cdot Cd^2 \cdot \pi^2 \cdot Dh^2 \cdot \rho}\right),$$

where Lp is the thickness of the flow distribution plate, Dh is the diameter of the holes in the flow distribution plate, Nh is number of holes, and Cd is the discharge coefficient of the holes.

Based on experiments, it has been determined that the following design guidelines produce appropriate flow distribution through a flow distribution plate divided into four quadrants:

$$\left(\frac{\Delta P\_h}{\Delta P\_p}\right) \geq R1 = 20; \qquad \text{EQ. 1}$$

$$0.10 \leq \left[Nh \cdot \left(\frac{Dh}{Di}\right)^2\right] \leq R2 = 0.21; \qquad \text{EQ. 2}$$

$$0.01 \leq \left(\frac{Dh}{Di}\right) \leq 0.10; \qquad \text{EQ. 3}$$

and $$5 \leq \left(\frac{vh}{vi}\right) \leq 11 \qquad \text{EQ. 4}$$

$$2 \leq \left(\frac{vi}{vp}\right) \leq 16,$$

where vh is the velocity in holes 208, vi is the velocity at inlet 202, and vp is the velocity in the volume enclosed by housing 200.

Continuing with the above example, from EQ. (4), let $$vh \geq \left(\frac{5+10}{2}\right) \cdot (vi) = 7.5 \cdot \left[\frac{mf}{\rho c \cdot \left(\frac{\pi}{4} \cdot Di^2\right)}\right] = 92.5 \left(\frac{m}{\sec}\right),$$

and $$vi = \frac{vh}{7.5} = \frac{9.25}{7.5} = 12.33 \left(\frac{m}{\sec}\right).$$

By keeping the volume small, $$vp = \frac{vi}{5} = 2.47 (m/s)$$

and $$\Delta P\_h \geq 20 \cdot \Delta P\_p = 1.5 \cdot \left(\frac{\rho c}{2}\right) \cdot \left(92.5\right)^2 1.5 \cdot \left(\frac{\rho c}{2}\right) \cdot (92.5)^2 = 7699$$

(Pascals). Combining equations 2 and 3 above with vh gives:

$$Nh\_avg \cdot \left(Cd \cdot \frac{\pi}{4} \cdot Dh\_avg^2 \cdot \rho c \cdot vh\right) = \left[Cd \cdot \frac{\pi}{4} \cdot (0.21 \cdot Di^2) \cdot \rho c \cdot vh\right].$$

But, from equation 3 above, Dh average equals 0.04.Di. Thus the resultant hole count is $$Nh\_avg = \frac{0.21 \cdot Di^2}{(0.04 \cdot Di)^2} = 130 \text{ Holes.}$$

From equation 2, with Di equal to 50.8 mm, the resultant hole diameter is $$Dh \geq Di \cdot \sqrt{\frac{0.21}{Nh}} = 50.8 \cdot \sqrt{\frac{0.21}{130}} = 2.042 \text{ mm} = 0.08 \text{ inches.}$$

From equation 4, the ratio vh/vi equals 5 for minimum volume. Using this ratio $$vp \leq \left(\frac{1}{5}\right) \cdot vi = \left(\frac{1}{5}\right) \cdot \left[\frac{mf}{\rho c \cdot \left(\frac{\pi}{4} \cdot Di^2\right)}\right] = 2.467 \left(\frac{m}{\sec}\right),$$

and $$W \cdot H \geq \frac{mf}{\rho c \cdot (2.467)} = 0.010 m^2.$$

If the width W of housing 200 is twice the height H of housing 200, $$H = \sqrt{\frac{0.010}{2}} = 71\_mm = 2.8\_inches,$$

and W equals 5.6_inches.

The following empirical table (TABLE 1) may be used to find an appropriate hole distribution for flow distribution plate 206. Since for the above example $$\frac{vh}{vp} = \frac{92.5}{2.47} = 37.5,$$

column "C" of table 1 is selected.

Using column C of Table 1, and the fact that the total number of holes needed for the example is 130, the number of holes for each of the four quadrants of flow distribution plate 206 is 48, 43, 22, and 17, respectfully, as shown in the table below (TABLE 2).

TABLE 2

| Plate %-Length | $30 < \left(\frac{vh}{vp}\right) \leq 40$ | HOLES | |
|---|---|---|---|
| 0-25% | 37% | 0.37 · 130 = | 48 |
| 25-50% | 33% | 0.33 · 130 = | 43 |
| 50-75% | 17% | 0.17 · 130 = | 22 |
| 75-100% | 13% | 0.13 · 130 = | 17 |
| | 100% | | 130 |

Figure 4:
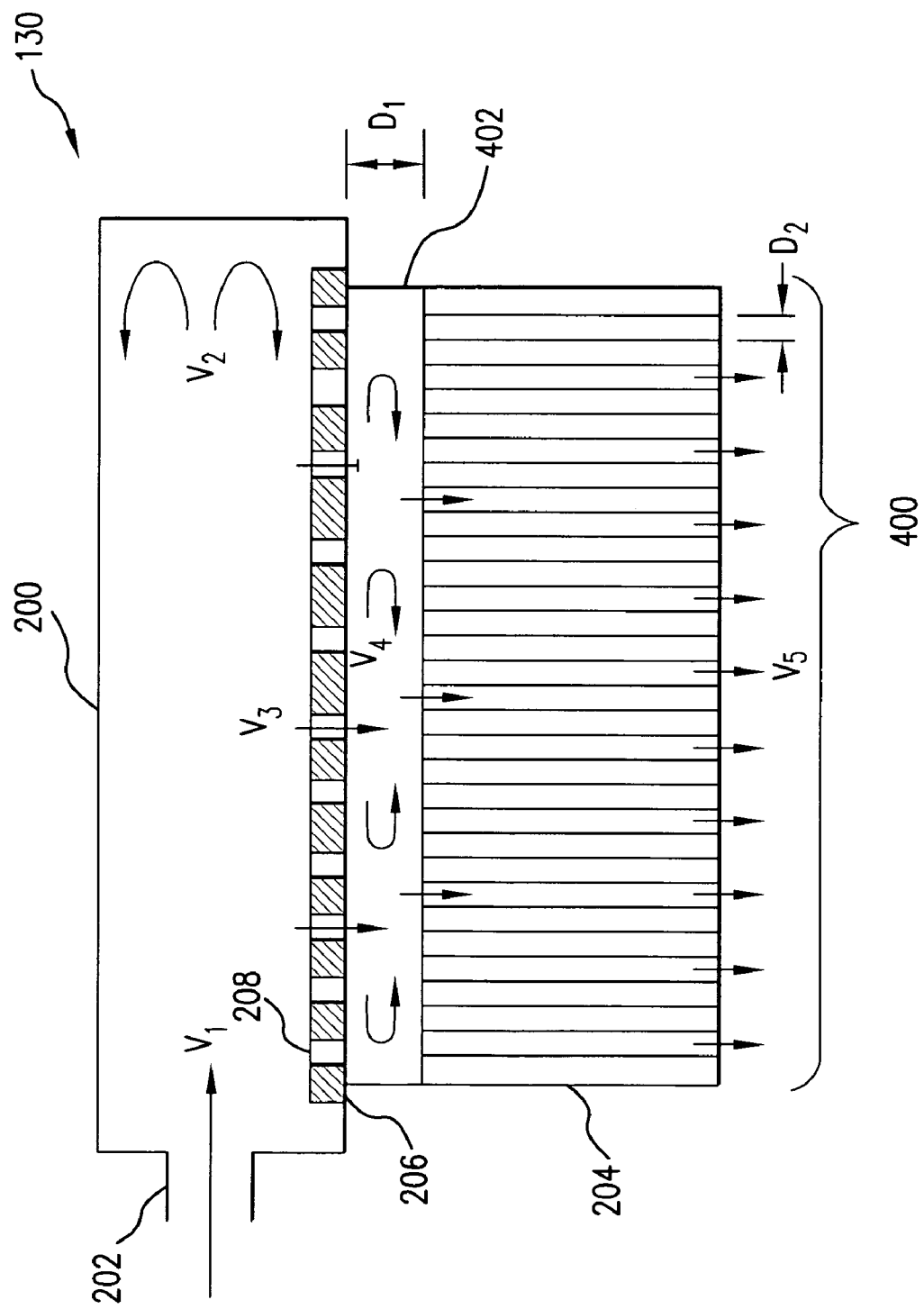
FIG. 4 is a schematic diagram showing the flow of gas through the nozzle of FIG. 2.

FIG. 4 is a schematic diagram showing the flow of gas through nozzle 130. As shown in FIG. 4, a plurality of flow conditioning channels 400 are located in a portion of housing 204. A space 402 exists in housing 204 between the ends of flow conditioning channels 400 and flow distribution plate 206. In an embodiment, wherein holes 208 of flow distribution plate 206 have a diameter D, the end of each flow distribution channel 402 is located at least a distance ten D from the surface of flow distribution plate 206.

In an embodiment, gas flows into first housing 200 via inlet 202 at a velocity $v_1$. As gas enters further into housing 200, it slows to a velocity $v_2$. The gas exits housing 200 via holes 208 in flow distribution plate 206 at a velocity $v_3$. The relationship between these velocities was described above by way of the example. In space 402, the velocity of the gas flow is $v_4$. The gas flow enters flow conditioning channels 400 and exits flow conditioning channels 400 with a velocity $v_5$.

The gas is forced to flow laminarly through flow conditioning channels 400, which have a prescribed length necessary to attenuate non-axial velocity flow-vectors such that the exiting flow-field is axially directional and encouraged to maintain its stream-tube direction (throw) for an extended distance after it exits flow conditioning channels 400. The resultant flow-field behaves as laminar (e.g., Reynolds Number much less than 2000) streamline flow, where the possibility of mixing occurring between streamlines is minimal over the effective "throw" distance. The laminar, streamline flow exiting flow conditioning channels 400 is ideally suited to efficiently refresh contaminated gaseous volumes and to control point heat sources.

TABLE 1

Percent-Of-Holes In Plate For Uniform Flow Distribution

| Plate Percent-Length | A $10 \leq \left(\frac{vh}{vp}\right) \leq 20$ | B $20 < \left(\frac{vh}{vp}\right) \leq 30$ | C $30 < \left(\frac{vh}{vp}\right) \leq 40$ | D $40 < \left(\frac{vh}{vp}\right) \leq 60$ | E $60 < \left(\frac{vh}{vp}\right) \leq 100$ | F $100 < \left(\frac{vh}{vp}\right) \leq 160$ | G $160 < \left(\frac{vh}{vp}\right) \leq 255$ |
|---|---|---|---|---|---|---|---|
| 0-25 | 43% | 40% | 37% | 34% | 31% | 28% | 26% |
| 25-50% | 39% | 36% | 33% | 30% | 27% | 26% | 25% |
| 50-75% | 11% | 14% | 17% | 20% | 23% | 24% | 25% |
| 75-100% | 7% | 10% | 13% | 16% | 19% | 22% | 24% |
| | 100% | 100% | 100% | 100% | 100% | 100% | 100% |

Figure 5:
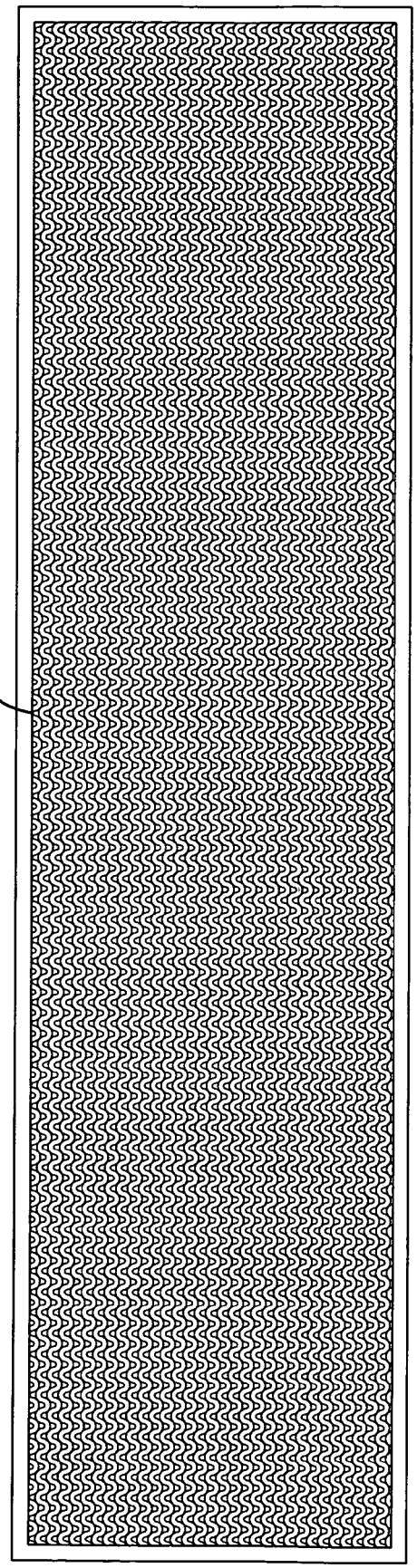
FIG. 5 is a diagram illustrating how the flow conditioning channels of a nozzle according to an embodiment of the present invention can be formed by a plurality of plates.

As shown in FIG. 5, in an embodiment, the plurality of flow conditioning channels are formed by a plurality of appropriately shaped plates 500. This simplifies the manufacturing of the flow conditioning channels. In other embodiment, each flow conditioning channel is formed, for example, by an individual tube.

The following example illustrates how to select appropriate parameters for flow conditioning channels according to an embodiment of the present invention. Following the design criteria of this example, it is possible to create a gas curtain having optimized performance, while utilizing minimum amounts of gas flow. The design criteria are based on minimizing jet-curtain turbulence and thereby reducing the amount of mixing between constant temperature curtain-gas (e.g., an air curtain) and hot ambient gases (e.g., environmental air). The design can be used to prevent index of refraction changes within a selected control volume.

For purposes of this example, the flow conditioning channels are assumed to be honeycomb-shaped, as shown in FIG. 5. Each honeycomb cell acts as an independent 2-D jet such that the overall height and width of housing 204 does not influence the effective performance of each axial jet. Local air curtain honeycomb flow uniformity can be assured, for example, by using a foam material as a back-pressuring device ahead of the honeycomb flow conditioning channels (in a portion of space 402 shown in FIG. 4).

It is known that slot turbulence is minimized and/or non-existent at Reynolds numbers (Res) less than or equal to 70 for a honeycomb solidity ratio of 0.098 (i.e., $R_{cr}$ (0.098)=70.504 per the following equation). (See also, e.g., FIG. 13 of the National Advisory Committee For Aeronautics, Technical Note 2001, Aerodynamic Characteristics of Damping Screens, National Bureau of Standards (January 1950), which is reproduced herein as FIG. 6). This ensures the flow-field is within a laminar flow regime. The Reynolds critical number as a function of solidity ration (sol) is given by:

$$R_{cr}(\text{sol})=79.7-108(\text{sol})+169.5(\text{sol})^2-177.72(\text{sol})^3,$$
where $0 \leq (\text{sol}) \leq 0.85$.

Figure 7:
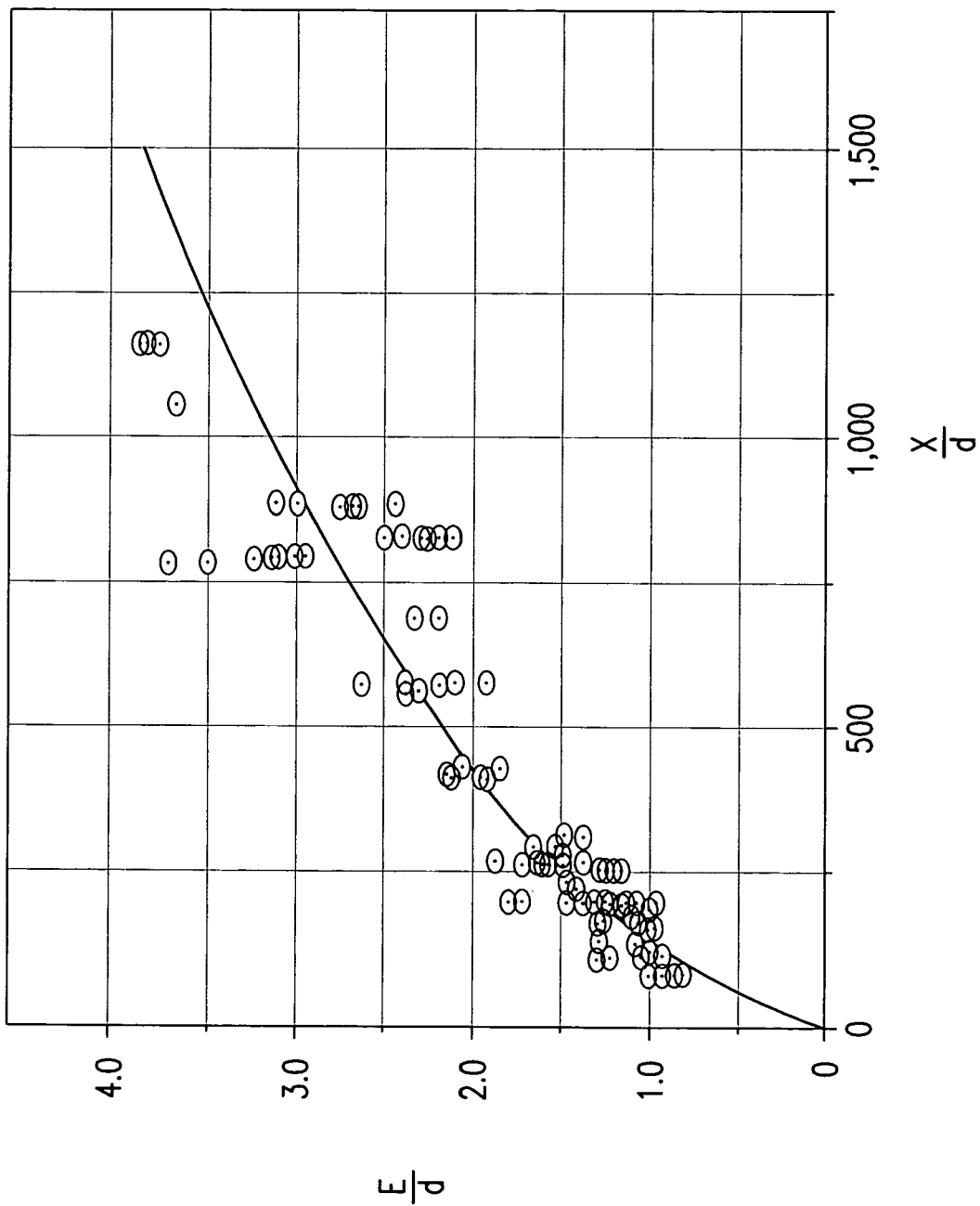
FIG. 7 is a graph of the scale of shedding vortices downstream of a grid of wire as a function of distance from the grid.

When transitioning from laminar to turbulent flat-plate gas curtain flow, the scale of shedding vortices downstream of the honeycomb gas injection slot is minimized over the length to be film protected when E/d is less than or equal to 1.0. (See, e.g., figure K-2 of H. L. Dryden "A Review of the Statistical Theory of Turbulence," Quart. Appl. Math., Vol. 1, No. 1 (April 1943), which is reproduced herein as FIG. 7). The value E/d is given by:

$$E/d = 9.2*10^{-3} \cdot (X/d) - 10.0*10^{-6} \cdot (X/d)^2 + 3.7*10^{-9} \cdot (X/d)^3$$

where $$0 \leq \left(\frac{X}{d}\right) \leq 1500,$$

for $$\frac{E}{d} \leq 1$$

$$\frac{X}{d} \leq 125.$$

Therefore, by knowing "X" (the length to be film protected, e.g., 20 inches), the hydraulic flow-tube diameter, "d", is defined or capped as a max-limit, and the flow rate is sized such that $Re_d = U1*d/v \leq Res$. For X equal to 20 inches, $$d \geq \frac{X}{125} = \frac{20}{125} = 0.16.$$

Figure 8:
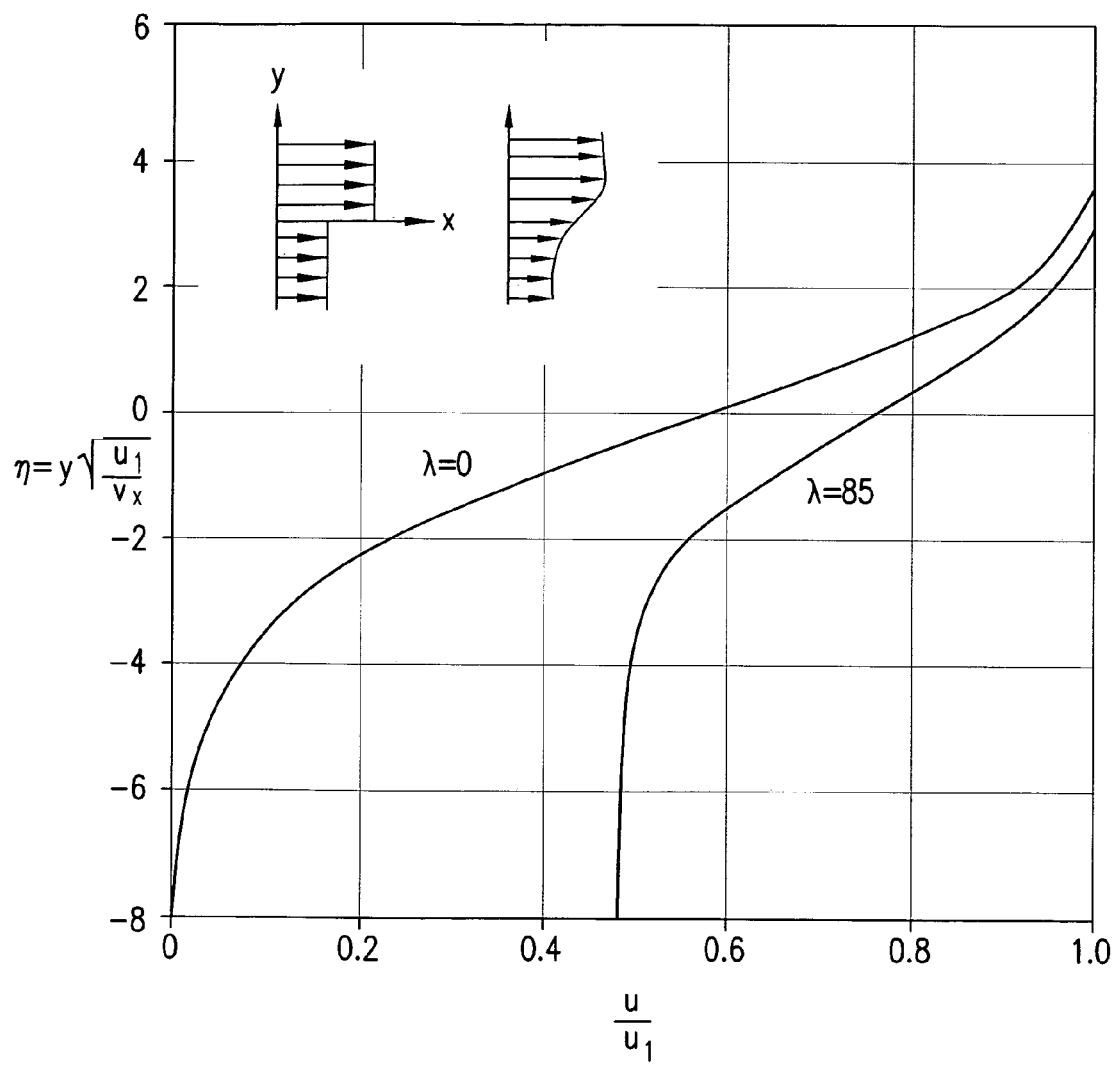
FIG. 8 is a graph of variations of cooling effectiveness or lack of mixing between two parallel flowing gas-streams.
Figure 9:
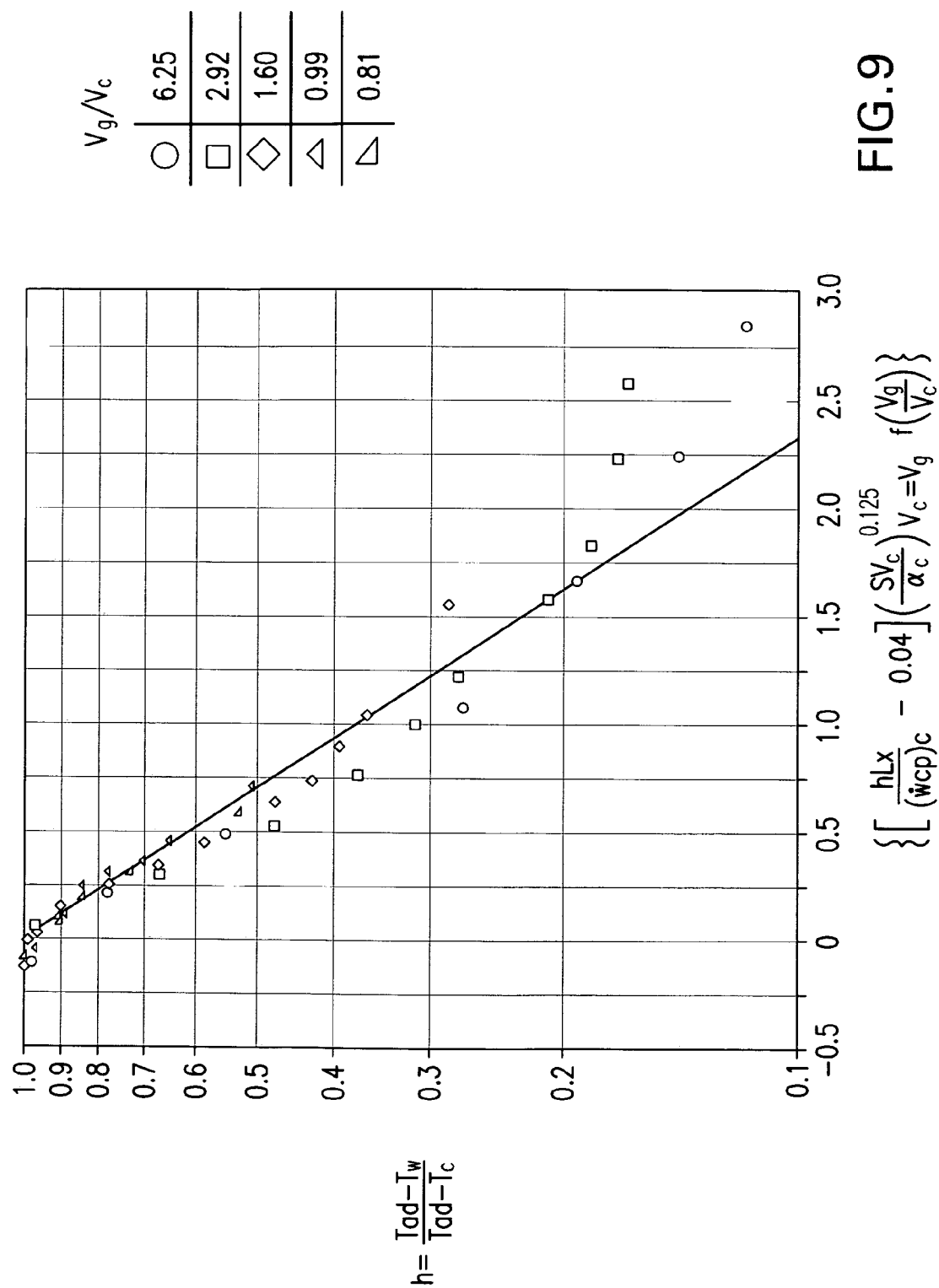
FIG. 9 is a graph of velocity distribution in a zone between two interlacing parallel flow streams, and it represents a measure of their mixing potential.

For a given $Re_d$ value, the corresponding injection film velocity "U1" is determined. This can be accomplished, for example, using available thermodynamic graphs. (See, e.g., FIG. 9.15 of H. Schlichting "Boundary Layer Theory," 6$^{th}$ Ed., McGraw Hill Inc, which is reproduced herein as FIG. 8). For $Re_d = U1*d/v \leq Res$, where Res is the actual streamtube Reynolds number, the corresponding injection film velocity U1 is determined from FIG. 8 for a total allowable slot height of y equals 50 mm, u equals 0.20*U1 (a 20% maximum allowable boundary layer mixing velocity for two interacting parallel streams), and h equals 2.4 (the quiescent ambient mixing flow-stream spreading factor for laminar boundary layers corresponding to u/U1=0.20) to be 0.95 ft/s (290 mm/s).

The corresponding injection film velocity "U1" may also be cross-checked or found using the Hatch & Papell turbulent film cooling correlation, as modified for laminar flow. (See FIG. 5 of Hatch, J. E. and Papell, S. S., "Use of a Theoretical Flow Model to Correlate Data for Film Cooling or Heating an Adiabatic Wall by Tangential Injection of Gases of Different Fluid Properties," TN D-130, 1959, NASA, which is reproduced herein as FIG. 9.) For laminar flow, $h_x = 0.332 \, Re_x^{1/2} \, Pr^{1/3}$, where $50 < Re_x < 5*10^5$. The resulting modified laminar film coolant flow effectiveness required is thus $\eta = (1-u/U1) = 0.8$.

To check the result for U1 determined above, the following equations are used and solved (e.g., iteratively) for a given L, X, y, $Cp_c$, $\mu_c$, $k_c$, $\rho_c$.

$$\eta = \left(1 - \frac{u}{U1}\right) =$$

$$0.8 = \exp\left[\left[\frac{0.332 \cdot \left[\left(\frac{Cp \cdot \mu}{k}\right)_c\right]^{\frac{1}{3}} \cdot \left(\frac{w_c \cdot X}{\mu \cdot L \cdot y}\right)^{\frac{1}{2}} \cdot L \cdot X}{(w \cdot Cp)_c} - 0.04\right]\left[\frac{\left(\frac{w_c}{L}\right)^2}{(k \cdot \rho \cdot y)_c}\right]^{\frac{1}{8}}\right]$$

where: L=slot width (m)
X=axial distance downstream from slot (m)
y=slot height (m)
Cpc=coolant specific heat (J/kg-K)
$\mu_c$=coolant dynamic viscosity (kg/m-sec)
$k_c$=coolant thermal conductivity (W/m-K)
$\rho_c$=coolant density (kg/m3)
U1=center-line coolant velocity (m/sec), and $$U1(\rho c, \mu c, X, y, \eta s) := \left(\frac{\eta s}{y}\right)^2 \cdot X \cdot \left(\frac{\mu c}{\rho c}\right).$$

For the example where X=55.0 mm, $\eta$s=2.4, y=4.0 mm, and L=90.8 mm, U1($\rho_c$, $\mu_c$, X, y, $\eta$s)=0.293 m/s. This confirms the value of 290 mm/s determined above using FIG. 8.

Having determined the value of U1, it is now possible to establish a hydraulic diameter for the U1 velocity and laminar flow-field. The scale of shedding vortices (E/d) downstream of the honeycomb flow conditioning channels (see FIG. 7) is directly proportional to the laminar boundary velocity mixing ratio u/U1=0.2 (see FIG. 8). Having established an allowable velocity mixing ratio of 0.2, one can attribute this value to E/d=0.2. Therefore, the value "X/d" is found from FIG. 7 as 125. For X equal to 20", this gives a value of d equal to 20/125 or 0.16 m.

Figure 6:
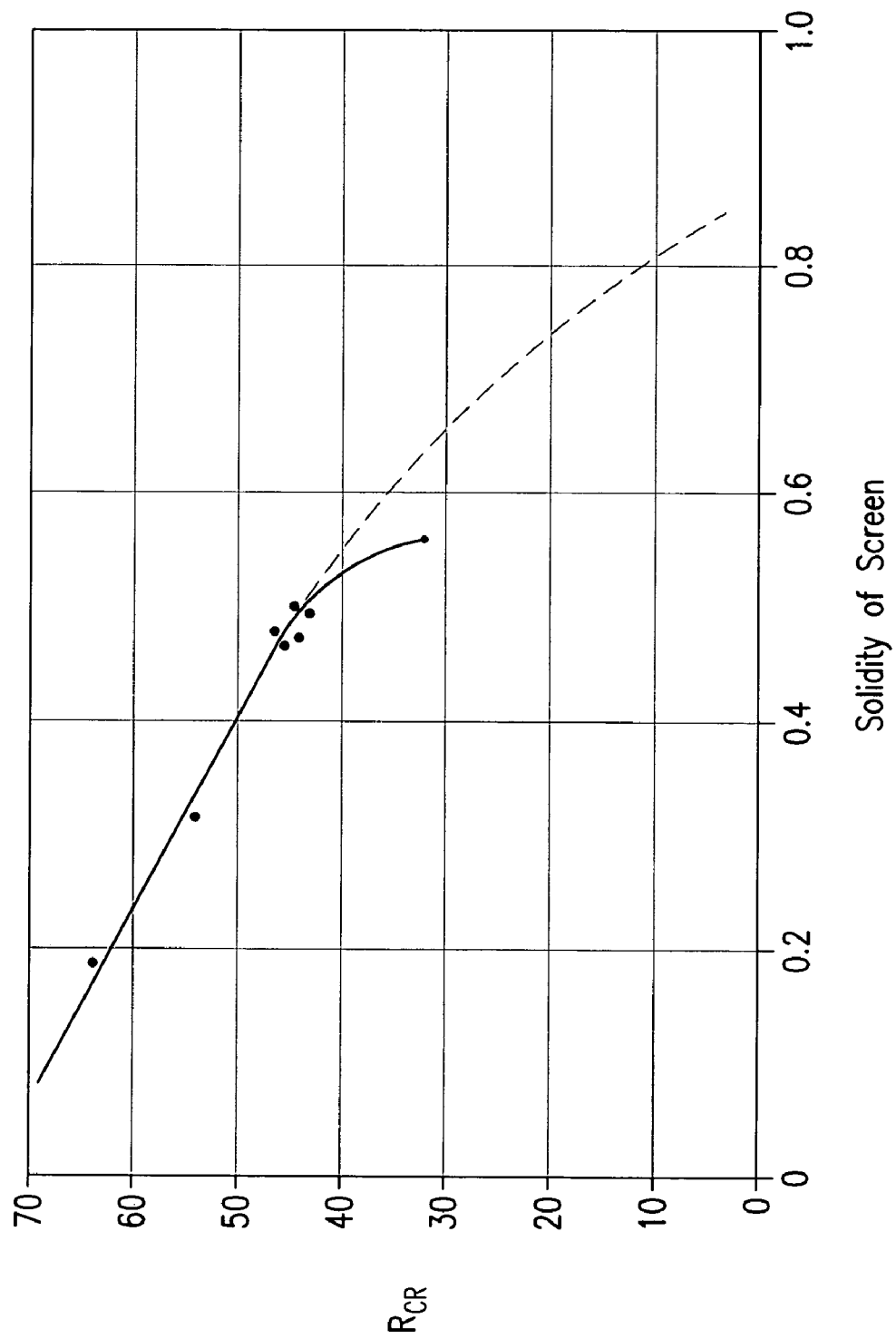
FIG. 6 is a graph of critical Reynolds numbers above which eddies are produced, and which shows dependency on the solidity of a screen.

From FIG. 6, and the equation:

$$R_{cr}(\text{sol}) = 79.7 - 108(\text{sol}) + 169.5(\text{sol})^2 - 177.72(\text{sol})^3$$

where $0 \leq (\text{sol}) \leq 0.85$, $R_{cr}(0.15) = 66.6$ and $R_{cr}(0.23) = 61.5$. Thus, for a honeycomb solidity ratio of 15 percent, $$\text{Re}_d = \frac{\rho c \cdot U1 \cdot d}{\mu c} \leq 66.6,$$

and for a honeycomb solidity ratio of 23 percent, $$\text{Re}_d = \frac{\rho c \cdot U1 \cdot d}{\mu c} \leq 61.5.$$

The actual stream-tube Reynolds Number for d-minimum is $$\frac{\rho c \cdot U1(\rho c, \mu c, X, y, \eta s) d\min}{\mu c} = 1.153 \times 10^6.$$

For purposes of this example, however, d is made equal to 0.032 so that $\text{Re}_H :=$ $$\frac{\rho c \cdot U1(\rho c, \mu c, X, y, \eta s) d}{\mu c}$$

or $$1.153 * 10^6.$$

Then, given a honeycomb wall thickness (tw) of 0.05 mm (2 mils), the number of honeycomb flow control channels Nc is $$\frac{4 \cdot L \cdot y}{\pi \cdot (dK + tw)^2}$$

or 621. That is to say for honeycomb flow conditioning channels fitting into a housing 204 of height y=4 mm and L=90.8 mm, and having wall thickness of 0.05 mm with an inner diameter of 0.813 mm, there should be a total of 621 flow conditioning channels. The solidity ratio for the values of this example is $$S(y, L, tw, d, Nc) := \frac{Nc \cdot [\pi \cdot (dK + tw) \cdot tw]}{y \cdot L}$$

or 23%.

As noted above, the critical Reynolds number is $R_{cr}(0.23) = 61.5$. In order to guarantee this number, it is preferable to use the d-minimum dimension to allow for margin. This margin is to account, for example, for geometric irregularities of the flow conditioning channels and possible local turbulence-mixing anomalies.

The total required coolant flow based on the established values for d-minimum and U1 is wc := $\rho c \cdot U1(\rho c, \mu c, X, y, \eta s) \cdot Ac$, where $$Ac = Nc \cdot \frac{\pi}{4} \cdot d^2.$$

Solving for wc, the total gas flow requirement is 0.041 kg/s.

Tests of the throw capability and arrival velocity of nozzle 130 were conducted using honeycomb flow conditioning channels having an length-to-diameter (L/D) ratio of 35 and 40, with a channel diameter of ⅛". These tests show that nozzle 130 performs best when the flow conditioning channels have an exit Reynolds number of 100 or less and that nozzle-throw performance is increased when the exit velocities of individual flow conditioning channels are within about +/−15-20% of the average exit velocity of the flow conditioning channels. It is noted, however, that other values and/or ranges of values can be used. These tests also show that (1) gas nozzle 130 can reduce purge gas consumption compared to conventional gas curtain system by at least a factor of five, (2) the purge gas is prevented from mixing with environmental gas during purging and allows purge displacement to be more piston-like, (3) the purge gas is able to handle cross-winds from any directional source, (4) the purge gas neutralizes any cross-wind velocity vectors typically experienced within a lithographic tool wafer stage; (5) the purge gas can accommodate asymmetric cross-winds, (6) the purge gas provides a thermally stable environment while simultaneously purging and cooling various heat sources; and (7) the purge gas is not easily dispersed nor mixed when encountering other flow-fields. These advantages are due, in part, to the fact that the purge gas exiting nozzle 130 presents a high-energy, directional flow-field that can dominate over other purge processes. Additional advantages of the present invention will become apparent to those skilled in the relevant art given the description herein.

While the foregoing is a complete description of exemplary embodiments of the invention, it should be evident that various modifications, alternatives and equivalents may be made and used. Accordingly, the above description should not be taken as limiting the scope of the invention which is defined by the metes and bounds of the appended claims. It will be understood that the invention includes all usable combinations of the appended claims.

What is claimed is:

1. A lithographic tool, comprising:
    a wafer stage having a surface to hold a wafer; and
    a nozzle, proximate to the surface, that directs a flow of gas, the nozzle comprising
    a first housing, that encloses a first volume, having an inlet for receiving a gas,
    a second housing, fluidly coupled to the first housing, that encloses a second volume,
    a flow distribution plate disposed between the first housing and the second housing that controls the flow of gas from the first volume to the second volume, and
    a plurality of flow conditioning channels disposed within a portion of the second volume wherein an end of each flow conditioning channel is separated from and located at a predetermined distance from a surface of the flow distribution plate.

2. The lithographic tool of claim 1, wherein the surface for holding the wafer is movable.

3. The lithographic tool of claim 2, wherein the nozzle moves together with the surface for holding the wafer.

4. The lithographic tool of claim 1, wherein the plurality of the flow conditioning channels are formed by a plurality of plates.

5. The lithographic tool of claim 1, wherein each of the flow conditioning channels has an exit Reynolds number less than 125.

6. The lithographic tool of claim 5, wherein each of the flow conditioning channels has an exit velocity within twenty-five percent of the average exit velocity for all of the flow conditioning channels.

7. The lithographic tool of claim 1, wherein the flow distribution plate includes a plurality of holes and the number of holes per unit area is higher at a first end of the flow distribution plate than at a second end of the flow distribution plate.

8. The lithographic tool of claim 7, wherein the holes of the flow distribution plate have a diameter D and the predetermined distance is at least ten D.

9. The lithographic tool of claim 1, further comprising:
an interferometry system that controls positioning of the surface, and
wherein the gas discharged by the nozzle provides thermal stability during interferometry measurements.

10. A lithographic tool, comprising:
a wafer stage; and
a nozzle, located adjacent to a surface of the wafer stage, that directs a flow of gas, the nozzle comprising
a first housing, that encloses a first volume, having an inlet for receiving a gas, a second housing, fluidly coupled to the first housing, that encloses a second volume,
a flow distribution plate disposed between the first housing and the second housing that controls the flow of gas from the first volume to the second volume, and
a plurality of flow conditioning channels disposed within a portion of the second volume wherein an end of each flow conditioning channel is separated from and located at a predetermined distance from a surface of the flow distribution plate, and
wherein each of the flow conditioning channels has an exit Reynolds number of less than 125 and an exit velocity within twenty-five percent of the average exit velocity of the flow conditioning channels.

11. The lithographic tool of claim 10, wherein the plurality of the flow conditioning channels are formed by a plurality of plates.

12. The lithographic tool of claim 10, wherein each of the flow conditioning channels has an exit Reynolds number of less than 100.

13. The lithographic tool of claim 12, wherein each of the flow conditioning channels has an exit velocity within fifteen percent of the average exit velocity for all of the flow conditioning channels.

14. The lithographic tool of claim 10, wherein the flow distribution plate includes a plurality of holes and the number of holes per unit area is higher at a first end of the flow distribution plate than at a second end of the flow distribution plate.

15. The lithographic tool of claim 14, wherein the holes of the flow distribution plate have a diameter D and the predetermined distance is at least ten D.

16. The lithographic tool of claim 10, further comprising:
an interferometry system for positioning the wafer stage, and
wherein the gas discharged by the nozzle provides thermal stability during interferometry measurements.

17. A nozzle for supplying a gas in a lithographic tool, comprising:
a first housing, that encloses a first volume, having an inlet for receiving a gas,
a second housing, fluidly coupled to the first housing, that encloses a second volume,
a flow distribution plate disposed between the first housing and the second housing that controls the flow of gas from the first volume to the second volume, and
a plurality of flow conditioning channels disposed within a portion of the second volume wherein an end of each flow conditioning channel is separated from and located at a predetermined distance from a surface of the flow distribution plate, and
wherein each of the flow conditioning channels has an exit Reynolds number less than 125 and an exit velocity within twenty-five percent of the average exit velocity for all of the flow conditioning channels.

18. The lithographic tool of claim 17, wherein the plurality of the flow conditioning channels are formed by a plurality of plates.

19. The lithographic tool of claim 17, wherein the flow distribution plate includes a plurality of holes and the number of holes per unit area is higher at a first end of the flow distribution plate than at a second end of the flow distribution plate.

20. The lithographic tool of claim 19, wherein the holes of the flow distribution plate have a diameter D and the predetermined distance is at least ten D.

* * * * *